United States Patent [19]

Chhabra

[11] Patent Number: 4,882,028
[45] Date of Patent: Nov. 21, 1989

[54] R-F ELECTRODES FOR REMOVABLY PROVIDING ELECTRICAL ENERGY TO AN APPARATUS DURING R-F ENERGY REACTIVE TREATMENT PROCESSES

[75] Inventor: Navjot Chhabra, Boise, Id.
[73] Assignee: Micron Technology, Inc., Boise, Id.
[21] Appl. No.: 147,315
[22] Filed: Jan. 22, 1988
[51] Int. Cl.$^4$ .................... B05C 13/00; C23F 1/02; C23C 16/00
[52] U.S. Cl. .................... 204/298; 118/500; 118/729; 118/730; 156/345
[58] Field of Search ............. 204/298 WH, 298 SC; 118/500, 503, 728, 729, 730, 731, 50.1; 156/345

[56] References Cited

U.S. PATENT DOCUMENTS

| | | | |
|---|---|---|---|
| 3,907,660 | 9/1975 | Gillery | 204/298 CS |
| 4,282,077 | 8/1981 | Reavill | 156/345 X |
| 4,424,096 | 1/1984 | Kumagai | 118/500 X |
| 4,448,149 | 5/1984 | Brown, Sr. et al. | 118/500 |
| 4,610,748 | 9/1986 | Engle et al. | 118/50.1 X |

Primary Examiner—Nam X. Nguyen
Attorney, Agent, or Firm—Stan Protigal; Wayne Duffy; Angus Fox

[57] ABSTRACT

An R-F electrode apparatus is provided featuring self-adjusting, spring biased electrodes, removably attached to a removable substrate holder, within a chamber used for plasma reactive treatment processes, particularly those involving semiconductor wafers. The apparatus further features base electrodes shaped and supported to insure uniform transmission of electrical energy during operation. The apparatus also provides an automatic means for wiping, self-cleaning action between the contact surfaces of opposing electrodes during introduction and removal of the substrate holder from the reaction chamber. The base electrodes are removably attached to standard electrical feedthroughs located in the reaction chamber wall, which lead to an external R-F power supply.

8 Claims, 3 Drawing Sheets

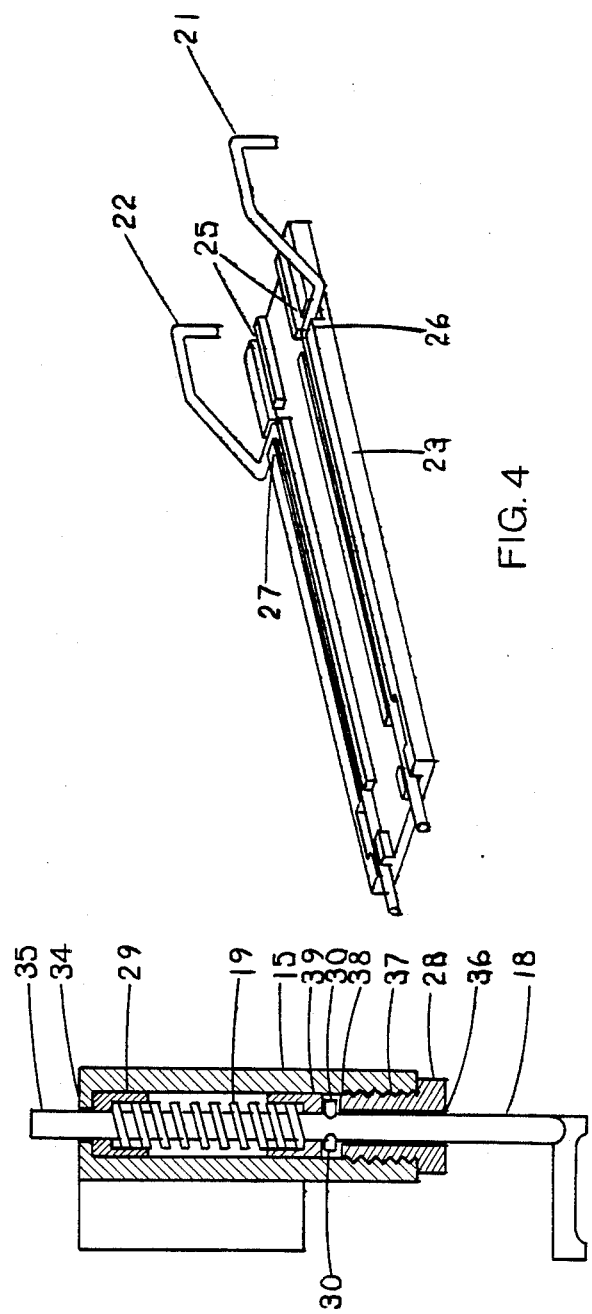

R-F ELECTRODES FOR REMOVABLY PROVIDING ELECTRICAL ENERGY TO AN APPARATUS DURING R-F ENERGY REACTIVE TREATMENT PROCESSES

BACKGROUND OF THE INVENTION

1. Field of the Invention.

The present invention relates to a radio frequency (R-F) electrode removably attached to an apparatus designed for removably mounting a substrate holder within a reaction chamber for treatment of semiconductor wafers used in the manufacture of semiconductor integrated circuits. The invention relates particularly to the structure of such an electrode and its use in an apparatus for plasma etching and chemical vapor deposition, hereinafter referred to as PECVD.

2. Description of the Prior Art.

Current methods for the manufacture of microcircuits and particularly semiconductor integrated circuits usually include plasma reactive treatment processes. The most common of these are plasma etching processes (PE) and chemical vapor deposition (CVD) processes.

Treatment of the semiconductor wafers or workpieces by plasma reaction begins after the workpieces are loaded on to a workholder which is then placed in a reaction chamber. The reaction chamber is sealed, evacuated and backfilled with a reaction gas, usually at a controlled, reduced pressure. An R-F energy field is applied within the chamber which raises the molecular energy level of the reactant gases to form a plasma which is characterized by the presence of large numbers of ionized chemical free radicals. The resulting chemical reaction between the free radicals in the plasma and the exposed surfaces of the semiconductor wafers is essentially a dry chemical reaction which leaves no noticeable residue once the R-F energy field and reaction are terminated. The chemical reaction is also a high energy reaction which occurs rapidly so that neither the wafers nor the apparatus are raised to temperatures which may affect the integrity of the pre-existing microstructures on the wafers.

Typical plasma reactions may lay down, through chemical vapor deposition (CVD), a nitride or oxide passivation layer on a wafer or, through plasma etching (PE), an inorganic fluoride compound may chemically attack and dissolve selective materials to which it is exposed or, by blanket removal, clean tools or workholders which may have been coated with films from previous CVD operations.

In current art a typical workholder which is electrically insulated from the reaction chamber, provides both support for the wafers in the reaction chamber and has attached R-F electrodes of opposing polarity, between which the plasma is generated. In the described apparatus the reaction chamber is a long, horizontally disposed tube. The workholder is a graphite boat with multiple vertical, parallel slots to support a plurality of semiconductor wafers in a vertical and equally spaced parallel relationship, and so to expose the wafers substantially equally to the plasma generated during the process. The workholder is supported in the chamber in an electrically insulated relationship with the chamber. Graphite is a preferred material as a workholder in a state-of-the-art PECVD apparatus since it is electrically conductive and structurally stable over the entire working temperature range.

However, graphite also may be characterized as soft and flaky and will show rapid wear and abrasion when subjected to repeated contact with harder materials. For this reason metal electrodes are usually secured in a removable and understood manner to the surface of the graphite boat. The electrodes, which may be of nickel alloy, stainless steel, or other etch resistant, yet electrically conductive material, are used for the repeated contact encountered in the placement, operation and removal of the workholder from the reaction chamber during normal manufacturing operations. The integrity of the electrical contact between the R-F electrodes attached to the graphite boat and those base electrodes leading to the power source external to the reaction chamber, becomes of primary importance. Any instability or interruption of this power adversely affects the uniformity of the reactive plasma and resultant deposition of the passivating layer or other film upon the semiconductor wafers.

Current commercial practice such as that used in the Advanced Semiconductor Material PECVD system, whose reaction chamber is also a long horizontally disposed tube, employs two metal R-F electrode holders fastened by conventional means to a graphite boat workholder. Each of these holders, by means of an enclosed, vertically disposed hollow, cylindrical shaft and a set screw, holds a rod shaped electrode whose downward extended end is L-shaped, with a horizontal and slightly concave bottom surface. This bottom surface extends laterally and is fixedly positioned prior to introduction of the workholder into the reaction chamber, so that it will press against the upper surface of an opposing horizontally disposed base R-F electrode that is oriented 90 degrees to the upper R-F electrode when the workholder is in place in the reaction chamber. The commercial base R-F electrodes are also rod shaped and are connected by means of set screws to electrical feedthroughs, sealably mounted in the wall of the reaction chamber, which lead to the external R-F power supply. They are insulated from the walls of the reaction chamber by being confined in longitudinal cylindrical holes in parallel spaced relationship in a flat bottomed rectangular ceramic insulator disposed along the long axis of, and supported in a generally horizontal plane on its parallel long side bottom edges, upon the inside curved surface of the reaction chamber. These base contacts pass through the insulators and then extend vertically upward and forward horizontally into the reaction chamber. The upper horizontal surface of the base R-F contact presses against the lower horizontal surface of the upper R-F electrode in a generally "+" configuration when R-F power reactive treatment is being performed.

A problem frequently encountered in using the above described system is the tendency of the base R-F electrode to become distorted horizontally and twisted or rotated laterally by the pressing force of the upper R-F electrode, if a slight lateral horizontal misalignment of the graphite boat or of the ceramic base insulator occurs during introduction of the workholder into the reaction chamber. This causes the upper R-F electrodes or the base electrodes not to be in the same horizontal plane. When the workholder is introduced into the reaction chamber there is no uniform sliding or pressing contact between the upper and lower electrodes unless they are perfectly aligned with respect to each other. This alignment is rare, since all of the electrodes are in fixed and inflexible positions. Any rotation of the workholder or base contact insulator about a horizontal axis results in uneven and unequal electrical contact between the electrodes. Any oxide or other impurity film remaining on the electrodes also may affect electrical conductance between them. Often one of the upper R-F electrodes presses too hard upon the opposing lower electrode and bends or distorts it and the other upper R-F electrode, being in a fixed position, does not achieve proper contact with its opposing R-F base electrode. Such a condition causes instability in the R-F energy induced plasma and results in uneven and unacceptable chemical vapor deposition upon the semiconductor wafers. The contact resistance of the R-F contacts becomes variable and difficult to control since the system is sealed during operation. This creates unacceptable operating conditions and low quality wafer products, of nonuniform layer composition.

Various attempts have been made to improve plasma stability during R-F powered reactive treatment. The patents of Shioya, et al (4,625,678), Matsuyama (4,615,299), and Kumagai, et al (4,424,096) each discloses an apparatus for the R-F treatment of semiconductor wafers during plasma treatment or the like. The patent of Brown, et al (4,448,149) discloses rotary R-F contacts and describes a system similar to that of the present invention. The Brown invention features an energy coaxial feedthrough fix mounted in the wall of the vacuum chamber for supplying external electrical and mechanical energy. It appears to be a sophisticated design with ramped rotary R-F contacts which apparently require electropolished, mirror finished contact points to minimize point high field intensity while permitting high energy input. No details of the R-F contacts are given.

The patent of Shibamata, et al (4,449,037) moves the furnace along the reaction tube rather than moving the wafer carrier through the furnace.

The patents of Lee (4,355,974) and Alberti, et al (4,098,923) relate to the structure of the workholder per se and are cited of interest.

Thus inspection of current art and available commercial equipment indicates that simple, reliable, stable and self-adjusting system of R-F electrodes such as in the described invention, is highly desirable during R-F powered reactive treatment of microcircuits and more particularly semiconductor wafers.

SUMMARY OF INVENTION

The present invention has been developed to solve the disabilities described above concerning R-F electrode contact instability, plasma instability, nonuniformity of film deposition upon semiconductor wafers and inability to accomplish simply, any manner of electrical or mechanical electrode self-adjustment once the R-F reactive process has commenced within the sealed reaction chamber. These disabilities appear to stem primarily from failure to achieve and maintain good and uniform electrical contact between the R-F electrodes on the workholder and the base electrodes attached to the feedthroughs from the R-F power supply.

In the present invention the base R-F electrodes extend horizontally in parallel spaced relationship, within grooves in a horizontally disposed, bottom, insulating and supporting ceramic plate, then laterally from the sides adjacent to the end of the bottom plate, then upwardly and forwardly at an inclined angle (as seen from the side), and then forwardly horizontally. The base R-F electrodes are confined within the grooves in the bottom ceramic plate by a flat sided ceramic cover of matching exterior dimensions. The upper R-F electrodes are adjustably contained in metal housings attached in a known manner to the graphite boat workholder, are spring biased, and terminate in laterally extending "feet" or surfaces which maintain uniform contact with the horizontal portions of the base electrodes. The ceramic insulator housing the base electrodes rests its bottom longitudinal edges, in a generally horizontal plane, upon the interior cylindrical walls of the reaction chamber. The lateral extension of the base electrodes from the sides adjacent to the end of the bottom plate essentially prevents twisting or rotation of the base electrodes and subsequent loss of electrical contact with the upper electrodes. It also serves to overcome any minor mechanical distortion or misalignment of the lower electrodes. Furthermore, when the workholder is introduced into the reaction chamber the upper R-F electrodes first encounter the sloping shoulder sections of the base electrodes. Because the upper electrodes are spring biased, the vertically downward and forward force exerts a uniform wiping action upon the contacting surfaces of the base electrodes and tends to remove any residual impurity or film existing which might otherwise interfere with electrical conductance. Later, when the workholder is removed from the reaction chamber, the contacting surfaces are again wiped clean. Thus the design inherently encourages better electrical contact and more uniform plasma and vapor deposition.

BRIEF DESCRIPTION OF THE DRAWINGS

The features and advantages of the present invention are best understood from the detailed description when read in reference to the accompanying drawing, wherein:

FIG. 3 is a pictorial view of the upper electrodes showing the spring loading and retaining mechanism controlling the electrode position.

FIG. 4 is a pictorial representation of the base electrodes as retained by the grooves in the lower ceramic insulator.

FIG. 5 is a side view of the base electrode holder with ceramic cover in place and R-F electrode connected to R-F feedthrough.

FIG. 6 is a pictorial representation of the base electrode ceramic cover showing the lip which covers the electrode-feedthrough connection.

DESCRIPTION OF PREFERRED EMBODIMENT

Figure 1:
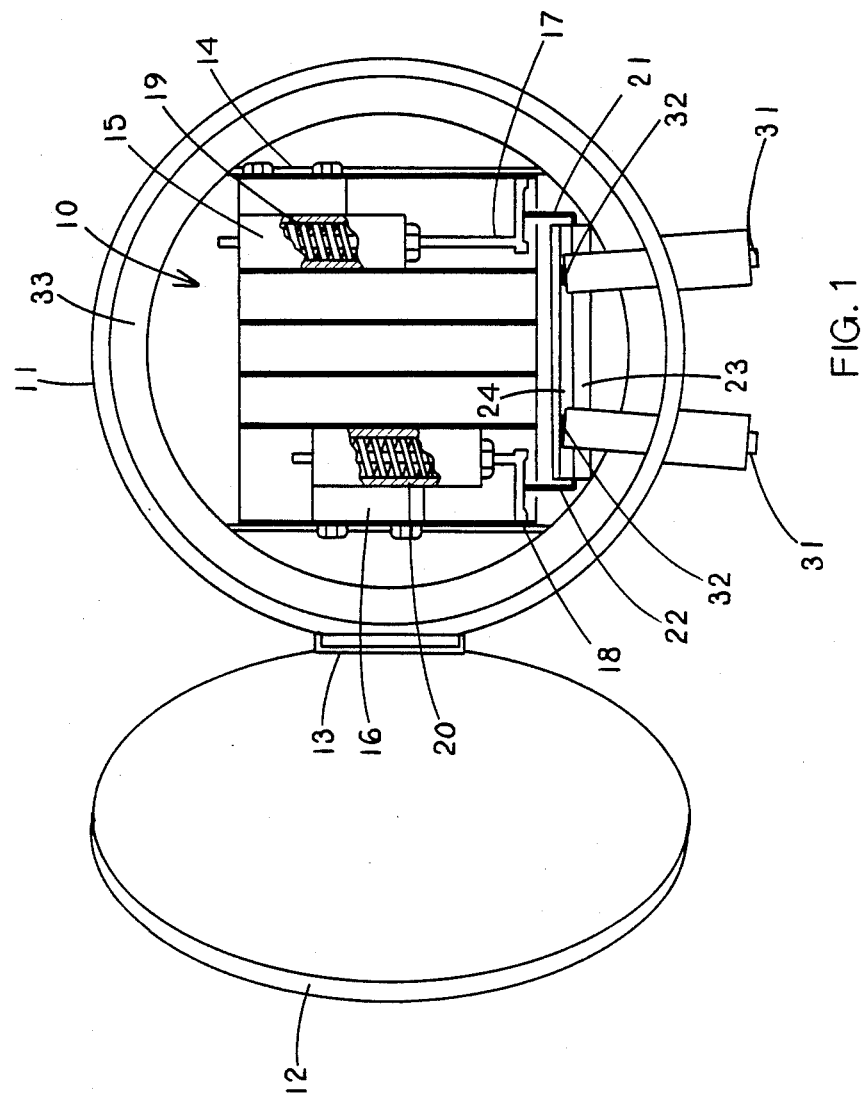
FIG. 1 is a simplified, partially cut away, representation of the open end of a plasma reaction chamber including a typical R-F electrode apparatus as improved by the features of the invention.

Referring to FIG. 1 there is shown a schematic representation of the open end 33 of an R-F powered plasma treatment reaction chamber 11 showing an R-F electrode apparatus which is designated generally by the numeral 10. The reaction chamber 11 is a horizontally disposed metal cylinder of known design which is closed at one end (not shown) and is hermetically and sealably closeable on the open end 33, in a known manner by metal door 12 hingably 13 and rotatably connected thereto in a known manner (not shown).

The reaction chamber 11 is part of a typical R-F powered, low temperature chemical vapor deposition (CVD) and plasma etching (PE) apparatus commonly used by the semiconductor industry in forming thin layers of material, such as passivating layers of nitride or oxide films or semiconductor epitaxial layers on semiconductor wafers (not shown).

The workholder 14 in the described embodiment is a mechanical structure of well-known design (not shown) but generally comprised of graphite, shaped in the form of a boat and having multiple vertical, parallel slots to support a plurality of semiconductor wafers in a vertical and equally spaced parallel relationship (not shown). This spacing permits essentially equal exposure of the wafers to the reactive plasma generated in the treatment process.

During customary operation the workholder 14, with wafers in place (not shown), is slideably inserted horizontally, in a known manner, into the reaction chamber 11. The workholder 14 furthermore is supported in an electrically insulated and well-known manner in relationship to the reaction chamber 11 (not shown). Within the reaction chamber 11 the workholder 14 becomes coupled to a radio frequency (R-F) power generator (not shown) in a manner to be described. The reaction chamber 11 is then hermetically sealed in a known manner, evacuated by a pumping system (not shown) and reaction gases of known, selected composition are introduced into the reaction chamber 11, usually at a reduced pressure. When the R-F generator (not shown) is activated, a plasma is formed in reaction chamber 11 and the chemical vapor deposition (CVD) process takes place. Of course, this process deposits films on all exposed surfaces within the reaction chamber 11, including the R-F electrodes and their holders. Such films will build up on the electrode surfaces during successive CVD operations and interfere with electrical conductance unless removed periodically after a CVD operation. Such a cleaning operation may be accomplished by using, in a known manner, a corrosive etching or cleaning gas of known composition. Failure to remove the interfering film from electrode surfaces will affect the uniformity of the plasma and its deposition upon the wafers. A second way to cleanse the mating surfaces of the R-F electrodes is to provide a means to mechanically abrade or scrape the electrode surfaces for the purpose of removing residually deposited film from the points of electrode contact prior to the commencement of and also following the next reaction process. If such a mechanical cleaning can be done conveniently, the frequency of plasma etching can be reduced or its period shortened.

The preferred embodiment describes such an apparatus 10. Previous R-F electrodes generally resembled in appearance the upper 17, 18 and lower 21, 22 electrodes of the preferred embodiment 10, with unique and distinct differences, to be described. The upper electrodes in previous commercial equipment were shaped similarly to electrodes 17, 18 as shown in FIG. 1 and FIG. 3. However, the previous electrodes were held in fixed positions vertically parallel to one end of the workholder by means of metal holders and set screws, which were fastened in a known manner to the graphite workholder, which workholder was similar or identical in design to that used in the preferred embodiment 10. Once the workholder was introduced into the reaction chamber no further vertical adjustment of the upper electrodes was possible. Therefore, initial physical alignment of the upper and lower electrodes was critical to proper electrical contact. The design of the lower R-F electrode in existing equipment also resembled generally that of the preferred embodiment, with an important distinction, to be described. The previous lower electrodes extended horizontally through a flat, rectangular, ceramic insulator having two parallel spaced longitudinal round holes reaching from end to end. The electrodes then extended vertically upward and then horizontally forward into the reaction chamber in parallel spaced relationship. The lower electrodes were fastened to the R-F feedthroughs by means of set screws as to be described in the preferred embodiment. Again the horizontal plane of the top horizontal surface of the lower electrodes was fixed by the physical dimensions of the electrodes. Any excessive vertically downward pressure exerted by the upper electrodes, due to horizontal misalignment or temperature change would tend to distort horizontally or laterally displace the lower electrodes and thus affect the electrical conductance between mating electrodes and therefore plasma uniformity and deposition.

Figure 2:
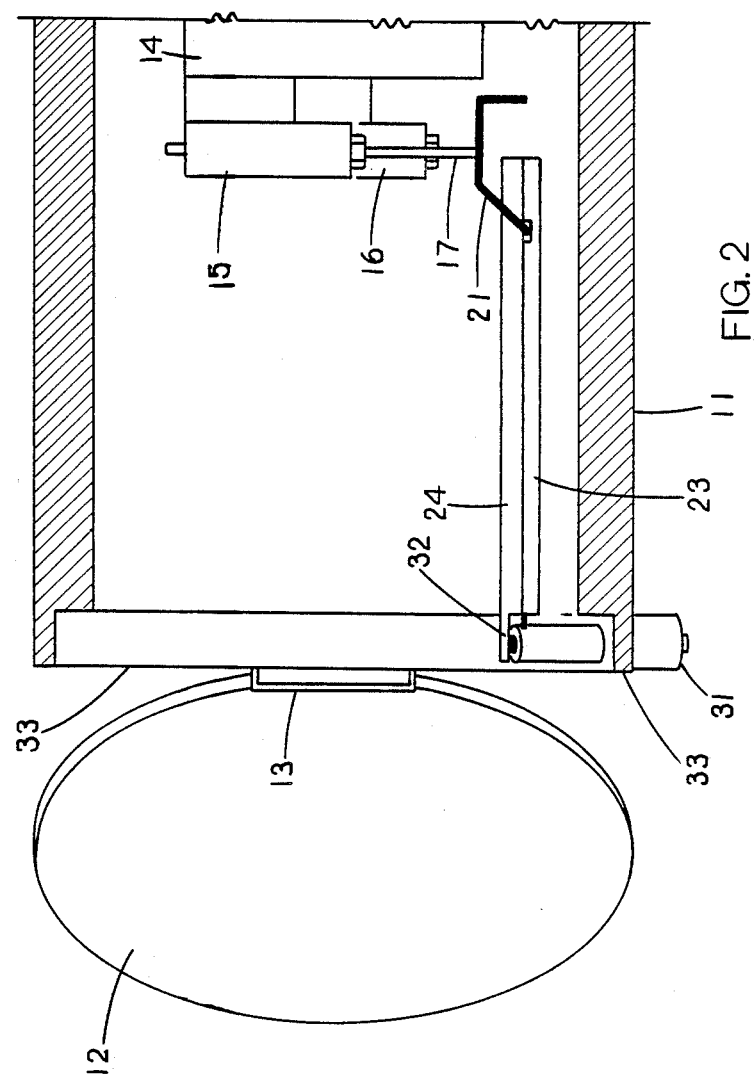
FIG. 2 is a cutaway side view of the apparatus showing the improved upper and lower electrodes in position.

In the preferred embodiment, as shown in FIGS. 1, 2 and 3, the upper R-F electrodes 17 and 18, composed of etch resistant metal of known composition, are held in parallel, vertically downward extending positions by means of metal electrode holders 15 and 16 respectively. Laterally the vertical segments of electrodes 17 and 18 are in the same vertical plane and parallel to one end of the workholder. The lower segments of electrodes 17 and 18 then extend laterally and horizontally away from each other in the same vertical plane, in an "L" shape to form "feet."

The upper electrode holders 15 and 16 are essentially identical to each other in design and differ only in dimension as dictated by the size and shape of the graphite workholder 14. FIG. 3 shows a frontal cutaway schematic view of upper electrode holder 15 which compares generally with 16 and which is comprised of a hollow metal cylinder closed at the upper end with a rectangular opening 34 in that end to closely circumscribe and permit sliding vertical motion of the upper electrode whose top end 35 is rectangular in cross section, to prevent axial rotation, and extends a short distance above the top of the electrode holder. This slight extension permits manual horizontal adjustment of the electrode for stress relief or alignment prior to introduction of the workholder 14 into the reaction chamber 11. The lower end of electrode holder 15 is enclosed by a metal plug 28 removably attached thereto by threads 37 or other known means. This plug has a circular opening, aligned vertically with the rectangular opening to closely circumscribe the vertical segment of the upper electrode 18, yet permit easy vertical movement of the upper electrode in a vertical plane.

Referring to FIG. 3, spring retainer end caps 29, of known design, are placed on opposite ends of helical spring 19, which is placed on the vertical segment of the upper electrode in an understood manner and the electrode 18 is assembled within the electrode holder 15 in a known manner. A retaining pin 30 is passed through a horizontally disposed hole 38 in the upper electrode 18 to transmit rising vertical force upon the helical spring and to limit the downward vertical travel and horizontal position of the electrode "feet." The location of this retaining pin 30 constitutes a coarse horizontal adjustment, discussed later, and will depend upon the dimensions of the apparatus and the ultimate horizontal position of base electrode 22. The electrode holders 15 and 16 are removably attached to one end of the graphite boat workholder 14 in parallel spaced relationship in a known and understood manner (not shown). The design of the spring assembly within the upper electrode holders may vary and does not limit this invention.

In the preferred embodiment the base electrodes 21 and 22, as shown in FIGS. 1, 2, 4, 5 are also rod shaped, etch resistant, electrically conductive metal having a slight resiliency. Each electrode is removably attached, in a known manner, to the interior end of R-F electrical feedthroughs 31 by means of a circumscribing hole 39 therein and set screw 32. The electrodes 21 and 22 then extend horizontally in parallel spaced relationship and are confined by parallel grooves 25 formed in a flat, rectangular shaped ceramic insulator support 23, as shown in FIG. 4 which rests on its long lateral edges upon the interior curved, cylindrical surfaces of reaction chamber 11, as shown in FIGS. 1 and 2. The bottom surface of the ceramic insulator 23 is flat and parallel to the top surface and the insulator is placed within the reaction chamber to rest freely and unrestrained, in a substantially horizontal plane. The electrodes 21, 22 extend horizontally to near the interior end of the ceramic insulator support 23 whereupon each electrode bends to extend laterally away from the other to the outer edge of the insulator 23 and each is confined within grooves 26 and 27 respectively in the ceramic insulator. Upon reaching the outer edge of the support insulator each electrode 21, 22 extends upwardly and forwardly in a sloping manner (as seen from the side) and then forward horizontally. Each electrode 21, 22 then extends downward vertically a very short distance to provide mechanical stability but not so far as to permit electrical contact with the interior surface of the reaction chamber 11, as shown in FIG. 2 Finally, as shown in FIGS. 1, 2, 5, 6 a ceramic insulator cover 24 of matching configuration and composition is releasably attached to said insulator 23 by a known means, for covering the base electrodes 21, 22 confined within the grooves 25, 26, 27. The ceramic insulator cover 24 also extends horizontally, by means of a short lip on one end, over and above the connections between the R-F feedthroughs 31 and electrodes 21, 22 to shield those connections from chemical vapor deposition. The radio frequency (R-F) feedthroughs 31 are standard units of known design which are sealably introduced through the exterior wall 33 of the reaction chamber 11 in an understood manner to connect to an exterior R-F power supply (not shown) and form no part of this invention.

In the preferred embodiment 10 the upper electrodes 17, 18 are adjusted vertically, prior to introduction of the workholder 14 into the reaction chamber 11. This adjustment is made to place the horizontal free resting position of the bottom of the "feet" of the electrodes 17, 18 in a horizontal plane slightly below the free resting horizontal plane of the upper surfaces of base electrodes 21, 22. This adjustment is usually achieved by location of the retaining pin 30 in the electrode holders 15, 16 but may be done by other known adjustment means of the electrode holders 15, 16 (not shown). When the upper electrodes 17, 18 are so adjusted they will, upon sliding introduction of the workholder 14 into the reaction chamber 11, in a known manner, first strike the forwardly sloping portions of the base electrodes 21, 22 as shown in FIGS. 2, 4. This forward motion establishes initial physical contact between the upper electrodes 17, 18 and base electrodes 21, 22 respectively. As the workholder 14 continues to move forward to its final resting place within the reaction chamber 11, the upper electrodes 17, 18 maintain sliding contact with upper surfaces of the base electrodes 21, 22 by means of the spring biasing of the upper electrodes against the slightly resilient base electrodes, as provided by springs 19, 20 in electrode holders 15, 16 respectively. This sliding contact tends to mechanically and by abrasion, remove any residual vapor deposited film from previous CVD operations and restore optimum electrical conductance between the mating upper and base electrodes. The spring biasing of the upper electrodes 17, 18 and the slight resiliency of the base electrodes 21, 22 also tend to compensate for any horizontal axial or lateral misalignment of the electrodes which may arise from mechanical distortion of the electrodes or temperature change. When the workholder is removed after the vapor deposition process is completed, the contacting electrodes again wipe each other clean from the newly deposited film, thus preparing the system for the next treatment cycle.

The lateral extensions of the base electrodes 21, 22 within the ceramic support insulator grooves 26, 27 provide an additional support for these electrodes 21, 22 which resists lateral displacement of the horizontal surfaces of the base electrodes which are in electrical contact with the upper electrodes. Such lateral displacement may result from excessive vertically downward pressure exerted by the upper electrode upon the mating surface of base electrode 21, 22, which may then become distorted and cause poor electrical contact between the mating surfaces. Previous commercial and known electrode designs did not provide the strong lateral support of the base electrodes shown in the preferred embodiment. The base electrode frequently twisted about its long axis and provided poor contact.

The present invention has been fully described in a preferred embodiment but many modifications and variations may become apparent to those skilled in the art. However the scope of the present invention is not limited by the above described details but only by the terms of the appended claims.

What I claim is:

1. A ratio frequency (R-F) electrode apparatus for removably providing electrical energy to a chemical vapor deposition and plasma etching system during R-F energy reactive treatment processes being carried out in an existing evacuable reaction chamber, the apparatus comprising:

a plurality of base electrode means removably attached to existing feed throughs fixedly mounted on said reaction chamber for transmitting R-F energy from outside the reaction chamber to inside the reaction chamber;

a plurality of upper electrode means oriented to permit controllable electrical and physical contact of said upper electrode means with said base electrode means and removably and electrically attached inside the reaction chamber to upper electrode holder means;

the electrode holder means electrically and removably attached to an existing workholder in a horizontally disposed reaction chamber, the workholder being for retaining substrates in the reaction chamber during substrate processing and the upper electrode holder means being for adjustably holding and controlling the mechanical and electrical relations of the upper electrode means with the base electrode means which oppose and are oriented to permit electrical and physical contact with said upper electrode means;

a ceramic insulator means for enclosing, insulating and supporting the base electrode means within the reaction chamber.

2. The apparatus of claim 1 wherein;

the upper electrode means are removably and adjustably held within the upper electrode holder means by a removably enclosed helical shaped spring means circumscribing each upper electrode means and biasing each upper electrode means in its relation to an opposing base electrode means, for providing uniform, self-adjusting electrical contact and vertical downward pressure upon said base electrode means; and each of said upper electrode means has a mechanical, retaining means for limiting its downward vertical travel, and for transmitting vertical force upward against said helical spring means for its horizontal manual adjustment in relation to the opposing base electrode means.

3. The apparatus of claim 1 wherein:

a plurality of said base electrode means are horizontally disposed within the reaction chamber;

said base electrode means extend horizontally in a parallel spaced relationship, then laterally to each side, then upwardly and forwardly at an inclined angle, as seen from the side, and the forward horizontally and then terminate downward vertically, for providing horizontal stability and uniform electrical contact with upper electrode means;

the lateral extension of said base electrode means is for providing a lateral stability to said base electrode means and uniform electrical contact, when subjected to vertical downward force by upper electrode means; and the inclined angle of said base electrode means is for enabling gradual and sliding physical contact between upper electrode means and opposing base electrode means during introduction and removal of the workholder from the reaction chamber and for providing a wiping and cleaning action upon the physically contacting surfaces of the opposing base electrode means and upper electrode means.

4. The apparatus of claim 1, wherein the base electrode insulator means consists of a flat, rectangular shaped ceramic plate, horizontally disposed and removably supported within the reaction chamber and having multiple straight grooves in parallel spaced relationship and extending the length of the plate and then lateral grooves extending laterally from the sides adjacent to the end of the plate, and intersecting the straight grooves, the multiple parallel and lateral grooves being for containing, insulating and supporting the base electrode means;

wherein said base electrode insulator means further consists of a flat ceramic plate of similar configuration removably covering said base electrode insulator means and for protecting said base electrode means and connecting feedthroughs from reactive processes.

5. A radio frequency (R-F) electrode apparatus for removably providing electrical energy to a chemical vapor deposition and plasma etching system during R-F energy reactive treatment processes being carried out in an existing evocable reaction chamber, the apparatus comprising:

a plurality of base electrodes removably attached to existing feedthroughs fixedly mounted on said reaction chamber for transmitting R-F energy from outside the reaction chamber to inside the reaction chamber;

a plurality of upper electrodes oriented to permit controllable electrical and physical contact of said upper electrodes with said base electrodes the plurality of upper electrodes being removably and electrically attached inside the reaction chamber to upper electrode holder means;

upper electrode holder means electrically and removably attached to an existing workholder in a horizontally disposed reaction chamber, the workholder being for retaining substrates in the reaction chamber during substrate processing the upper electrode holder means adjustably holding and controlling the mechanical and electrical relations of the upper electrodes with the base electrode;

the base electrodes being opposed to said upper electrodes and oriented to permit electrical and physical contact with said upper electrodes; and ceramic insulator means for enclosing, insulating and supporting the base electrodes within the reaction chamber.

6. The apparatus of claim 5 wherein:

the upper electrodes are removably and adjustably held within the upper electrode holder means by a removably enclosed helical shaped spring circumscribing each upper electrodes and biasing each upper electrodes in its relation to an opposing base electrodes, for providing uniform, self-adjusting electrical contact and vertical downward pressure upon said base electrodes; and each of said upper electrodes has a mechanical, retaining means for limiting its downward vertical travel, and for transmitting vertical force upward against said helical spring for its horizontal manual adjustment in relation to the opposing base electrodes.

7. The apparatus of claim 5 wherein:

a plurality of said base electrodes are horizontally disposed within the reaction chamber;

said base electrodes extend horizontally in a parallel spaced relationship, then laterally to each side, then upwardly and forwardly at an inclined angle, as seen from the side, and then forward horizontally and then terminate downward vertically, for providing horizontal stability and uniform electrical contact with upper electrodes;

the lateral extension of said base electrodes is for providing lateral stability to said base electrodes and uniform electrical contact, when subjected to vertical downward force by upper electrodes; and the inclined angle of said base electrode is for enabling gradual and sliding physical contact between upper electrodes and opposing base electrodes during introduction and removal of the workholder from the reaction chamber and for providing a wiping and cleaning action upon the physically contacting surfaces of the opposing base electrodes and upper electrodes.

8. The apparatus of claim 5, wherein:

the base electrode insulator means consists of a flat, rectangular shaped ceramic plate, horizontally disposed and removably supported within the reaction chamber and having multiple straight grooves in parallel spaced relationship and extending the length of the plate and then lateral grooves extending laterally from the sides adjacent to the end of the plate, and intersecting the straight grooves, the multiple parallel and lateral grooves being for containing, insulating and supporting the base electrodes; and said base electrode insulator means further consists of a flat ceramic plate of similar configuration removably covering said base electrode insulator means and for protecting said base electrodes and connecting feedthroughs from reactive processes.

* * * * *